(12) United States Patent
Kowalski et al.

(10) Patent No.: US 6,930,325 B2
(45) Date of Patent: Aug. 16, 2005

(54) TEST STRUCTURE FOR IMPROVED VERTICAL MEMORY ARRAYS

(75) Inventors: Bernhard Kowalski, Munich (DE); Andreas Felber, Dresden (DE); Valentin Rosskopf, Poettmes (DE); Juergen Lindolf, Friedberg (DE); Till Schloesser, Dresden (DE); Bernd Goebel, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/766,902

(22) Filed: Jan. 30, 2004

(65) Prior Publication Data

US 2005/0040398 A1 Feb. 24, 2005

(30) Foreign Application Priority Data

Jan. 31, 2003 (DE) ........................................ 103 03 963

(51) Int. Cl.[7] ............................................. H01L 23/58
(52) U.S. Cl. ......................... 257/48; 257/301; 257/302
(58) Field of Search ........................... 257/48, 301, 302

(56) References Cited

U.S. PATENT DOCUMENTS

| 5,519,236 | A | | 5/1996 | Ozaki |
| 5,764,569 | A | | 6/1998 | Wright |
| 6,128,219 | A | * | 10/2000 | Pio et al. ............... 365/185.09 |
| 6,339,228 | B1 | * | 1/2002 | Iyer et al. ..................... 257/48 |

* cited by examiner

Primary Examiner—David Nelms
Assistant Examiner—Tu-Tu Ho
(74) Attorney, Agent, or Firm—Slater & Matsil, L.L.P.

(57) ABSTRACT

An integrated circuit arrangement that has an integrated test structure is provided. The integrated circuit arrangement includes a transistor array having vertical FET selection transistors electrically coupled to storage capacitors of an assigned memory cell array, the storage capacitors being formed vertically into the depth of a substrate in deep trenches. The test structure may enable a plurality of vertical FET selection transistors by a conductive electrode material embedded in an extended deep trench. With a test structure of this type, it is possible to evaluate characteristic values for leakage currents and capacitances at different semiconductor junctions and also between different sections of the integrated circuit arrangement and also to perform reliability stress tests.

20 Claims, 6 Drawing Sheets

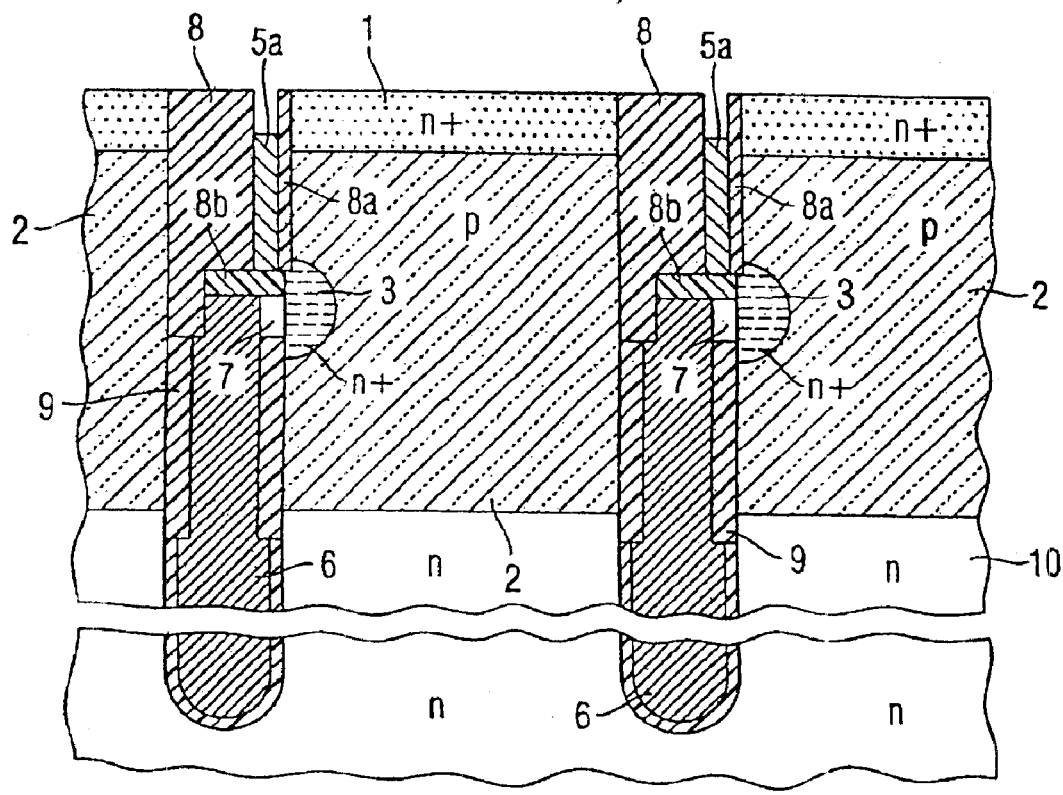
FIG 1
(PRIOR ART)
| | | |
|---|---|---|
|  Gate |  p (channel region) |  Insulation/dielectric |
|  Webs (AT) (source region) |  Poly-Si/tungsten/WL | 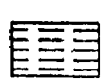 Drain region |

TEST STRUCTURE FOR IMPROVED VERTICAL MEMORY ARRAYS

BACKGROUND

1. Field of the Invention

The present invention relates generally to an integrated circuit architecture an more particularly to vertical transistor memories.

2. Background of the Invention

The continuing trend of size reduction of semiconductor memory components in products such as dynamic random access memory (DRAM) has led to development of vertical trench storage capacitors and more recently, vertical access transistors. Both devices are associated with the basic unit of a DRAM, the memory cell. An example of a DRAM cell based on a vertical access transistor is disclosed in U.S. Pat. No. 5,519,236. Use of a vertical trench capacitor and a vertical access transistor facilitates the fabrication of a semiconductor memory cell where F=70 nm or less, while at the same time making it possible to maintain the performance of the access transistor.

Such an integrated circuit architecture includes a transistor array comprising vertical FET transistors and storage capacitors formed vertically in deep trenches. Since the process for forming such devices is new, it is particularly desirable, during wafer processing and in general, to assess the properties and characteristic values of the selection transistors.

SUMMARY

An exemplary embodiment of the present invention comprises a test structure for an integrated circuit architecture that provides for an assessment or a detection of different characteristic values of a vertical FET transistor. In particular, a measurement is made of leakage currents and capacitances at junctions of the source and drain electrodes and at other interfaces. In order to be able to measure the buried structures, it is preferable that such a test structure provide access to the underside of the selection transistors via separate leads. Currentless and current-carrying access are preferably provided for in a separate fashion. In an exemplary embodiment, particular requirements of the new process which must be satisfied with regard to the word line concept, the formation of buried strips, and active webs can be assessed.

In accordance with an exemplary embodiment of the invention, a test structure is integrated into the integrated circuit arrangement, which test structure has, for the common connection of the drain terminals of a plurality of such vertical selection transistors, as first connecting means, in each case between two adjacent laterally offset selection transistors diagonally extended deep trenches filled with the conductive electrode material, the buried strip present there forming the drain electrodes of the adjacent vertical selection transistors at the intersection of the BS strip form with the extended deep trench. Preferably, the test structure is connected to a transistor array that comprises vertical FET selection transistors. The transistor array may be formed in a substrate in the form of parallel active webs made of semiconductor, arranged in a lateral direction of the circuit. The transistors may include drain terminals formed by conductive strips buried below the active webs, and gates formed by a spacer etched vertically at the side of the active webs. The buried strips in each case make contact with an electrode of a storage capacitor of a memory cell array assigned to the transistor array. The vertically etched spacer forms a word line for the memory cells of the memory cell array, and each storage capacitor is formed in a deep trench, which in each case delimits on the end side a section of the active web that contains the vertical selection transistor, and which is filled with conductive electrode material.

An integrated circuit arrangement according to the one exemplary embodiment of the present invention has such a test structure that can be built on a wafer separately between the actual chips (between the products to be produced) by means of the same process.

BRIEF DESCRIPTION OF THE DRAWINGS

FIG. 1 illustrates a diagrammatic cross section through a section of a known integrated circuit architecture with vertical FET transistors and storage capacitors formed in deep trenches.

DESCRIPTION OF THE PREFERRED EMBODIMENTS

Figure 2A:
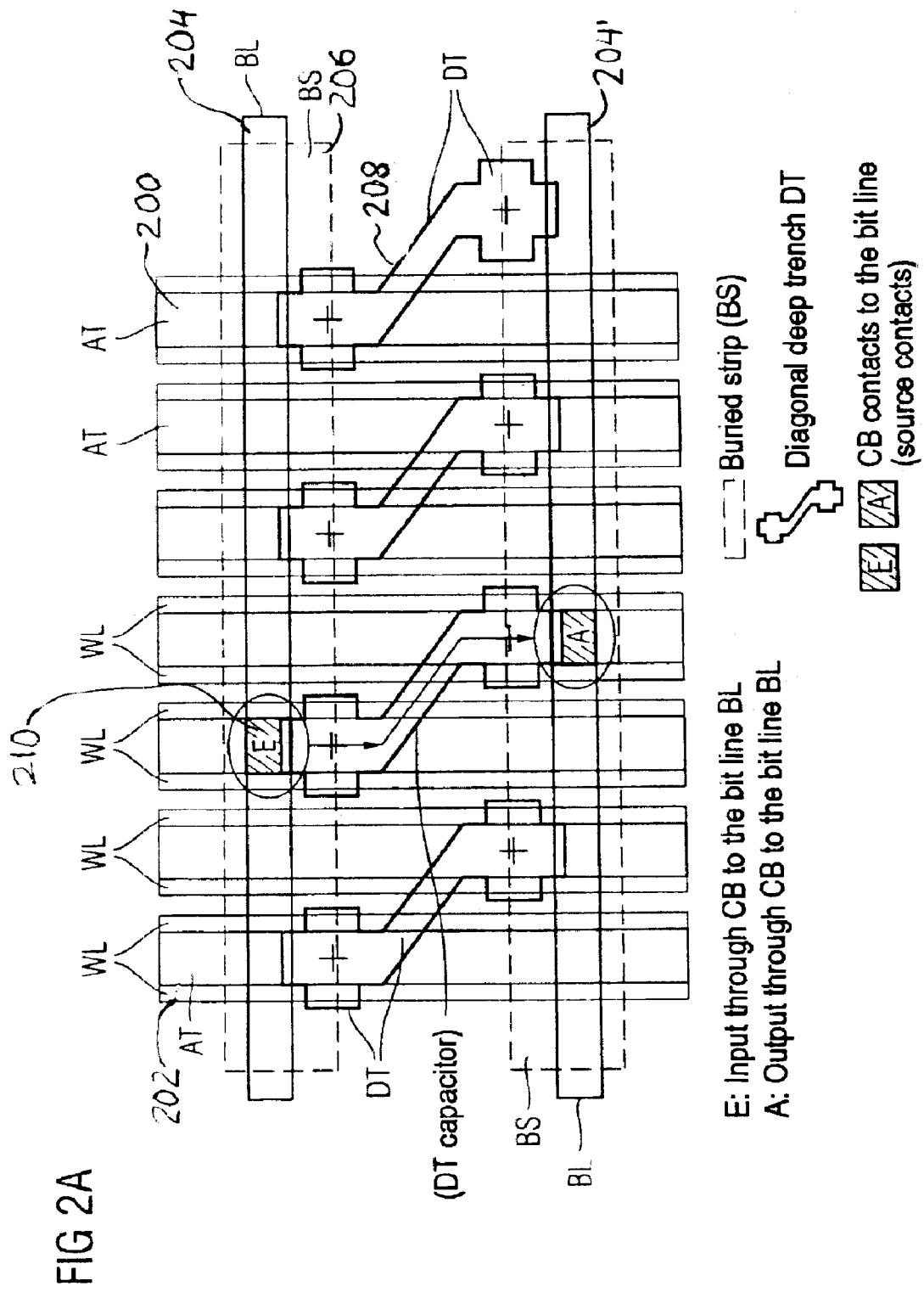
FIG. 2A illustrates a diagrammatic plan view of a section of a test structure according to an exemplary embodiment of the present invention, which provides a connection between two laterally offset vertical selection transistors by means of a deep trench extended diagonally between the transistors.

The following list of reference symbols is used consistently in the discussion to 1 Source electrode (active web)
2 Channel-forming P-type region
3 Drain electrode (buried strip DS)
5a Section of the gate electrode (word line WL)
6 Capacitor electrode
8, 8a, 8b Insulating layers
9 Dielectric
10 Substrate
AT Active Web
BL Bit line
CB Contact to the bit line (source contact)
BS Buried conductive strip
DT Extended deep trench or zigzag deep trench
A Output through CB from the bit line BL
E Input through CB to the bit line BL
DUT Device under test
M0 Metal plane 0

Before describing the preferred embodiments of the present invention, a known transistor array based on U.S.

Pat. No. 5,519,236, which contains vertical field effect transistors will be described with reference to FIG. 1.

The accompanying FIG. 1 diagrammatically shows a cross section through a section of a known integrated circuit architecture, through one of the active webs forming the active semiconductor regions. In a corresponding process, bulk, source and drain electrodes of the FET selection transistors are formed in the silicon-filled active webs. FIG. 1 shows two adjacent transistor sections of the FET selection transistors, which, in the active web sections, have an $n^+$-type source region 1, a channel-forming p-type region 2 and an $n^+$-type drain electrode 3 formed by means of a buried strip. FIG. 1 also shows two storage capacitors which are formed in a deep trench and are in each case represented by a capacitor electrode 6 (for example made of polysilicon) and an insulating dielectric 9. The capacitor electrode 6 of the storage capacitors is in contact via a conductive section 7 with the drain electrode 3 (buried strip) of the an associated selection transistor.

FIG. 1 also shows insulating layers 8, 8a, and 8b in each case for the insulation of the end-side sections 5a of peripheral gate electrode strips from channel-forming p-type regions 2 and drain electrode 3, on the one hand, and from conductive capacitor electrode section 6, on the other hand. The gate electrode strip, which is situated at the sides of the active web and of which only the transversely running section 5a can be seen in FIG. 1, simultaneously serves as a word line for the memory cell array assigned to the transistor array. Furthermore, source electrode 1, represented as a covering layer in FIG. 1, serves for producing a source terminal of the vertical FET transistors with an assigned bit line (not shown).

Figure 2B:
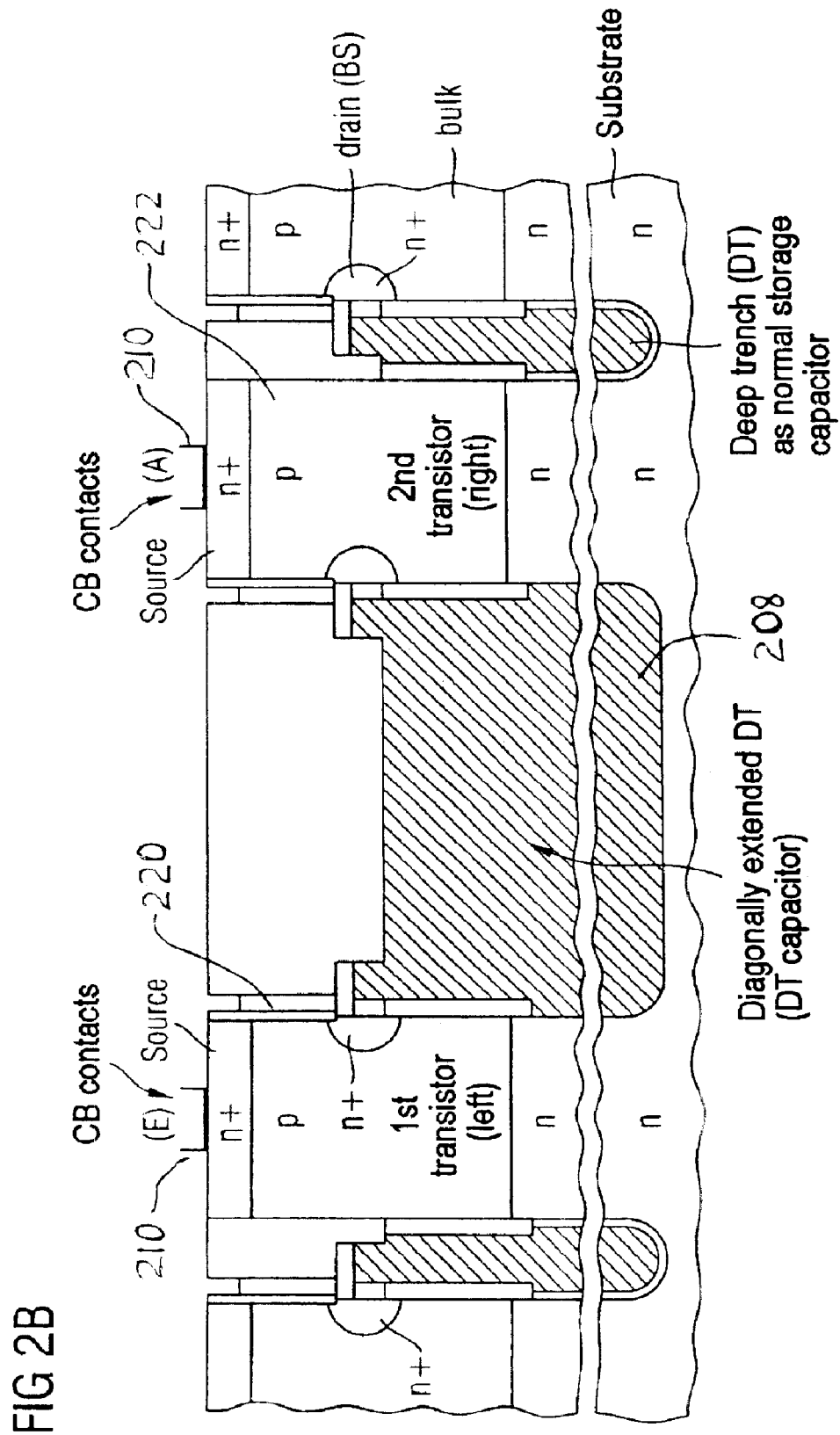
FIG. 2B illustrates a cross-sectional view along the section line E–A of FIG. 2A indicated by arrows depicting two vertical selection transistors connected back to back by a diagonally extended deep trench formed between them.

FIG. 2A illustrates a test structure according to an exemplary embodiment of the present invention, which connects in each case two adjacent and laterally offset vertical FET selection transistors. The illustration shows a plurality of vertical active webs (AT) 200, which have word lines (WL) 202 in each case on both sides, horizontally parallel-running bit lines (BL) 204 and buried conductive strips (BS) 206, which are formed where a BS mask (not shown) intersects a deep trench (DT) 208 (FIG. 2B). As explained with reference to FIG. 1, the drain electrodes of the vertical transistors or the buried drain contacts cannot be directly accessed from outside.

Figure 2C:
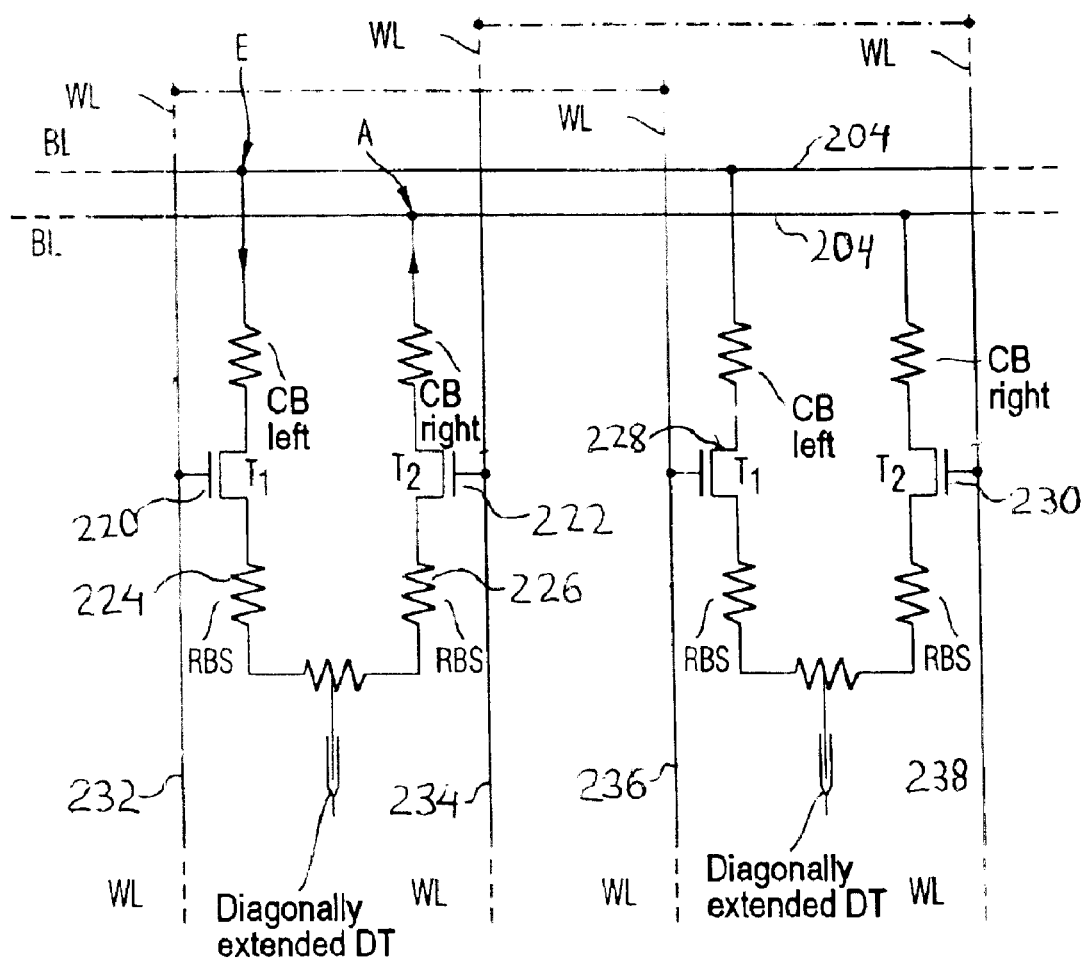
FIG. 2C diagrammatically illustrates an equivalent circuit diagram with discrete elements of the section of the test structure illustrated in FIGS. 2A and 2B, including possibilities for connection of the vertical selection transistors that are connected to one another by the diagonally extended deep trench.

An exemplary embodiment of the present invention includes an integrated test structure as illustrated in FIGS. 2A–2C, that forms a "back to back" connection between in each case two adjacent, laterally offset vertical selection transistors, since the buried drain electrodes (formed at the intersection of the BS shape with the deep trench 208 and the active web 200) are not accessible in such a vertical transistor. FIG. 2A shows four pairs of FET selection transistors that are connected to one another by the diagonal DT sections. In order to produce this connection, the integrated test structure includes diagonally extended deep trenches DT filled with the conductive electrode material acting as a first connecting means between in each case two paired laterally offset FET selection transistors. A second connecting means, namely source contacts (CB) 210, connect the test structure thus formed to separate bit lines BL at points which are identified in each case by E and A in FIGS. 2A and 2B.

FIG. 2B shows a diagrammatic cross-sectional view through a section of FIG. 2A with two vertical selection transistors connected back to back in this way. The section line running between E and A is indicated by arrows in FIG. 2A. FIG. 2B clearly shows that FET selection transistors 220 (1st transistor (left), and 222 (2nd transistor (right) are connected to one another back to back via their drain electrodes by an extended deep trench 208. Like the storage capacitors described above with reference to FIG. 1, deep trench 208 is filled with conductive electrode material, for, with polysilicon. The current path passes from the CB contact designated by E through first transistor 220 (left) into the polysilicon of the deep extended trench 208 and then through the second transistor 222 (right) to a CB contact 210 thereof, indicated by A. As mentioned, the CB contacts E and A of first and second selection transistors, 220 and 222, respectively, are in each case connected to a separate bit line BL (not shown).

Furthermore, as illustrated in FIG. 2a, selection transistors 220 and 222 are connected to separate word lines WL, which enable an independent control of the gates of the two selection transistors.

FIG. 2C depicts an equivalent circuit diagram of the test structure illustrated in FIGS. 2A and 2B with discrete elements. From the input E connected to a bit line 204 the current path passes through a CB contact 210, left-hand vertical selection transistor 220, a left-hand buried strip (RBS) 224, the diagonally extended deep trench 208, a right-hand buried strip 226, right-hand vertical selection transistor 222, a right-hand CB contact 210' to the output A, which is connected to a second parallel bit line 204'. A second pair of vertical selection transistors 228 and 230 that are connected to one another in this way is connected to the same bit lines BL-i204,204'. As mentioned above, in principle the gates of the transistors 220 and 222 can be controlled independently of one another by separate word lines, indicated by way of example by WL 232 and WL 234 in FIG. 2C. The same applies to the interconnected pair of selection transistors 228 and 230 whose gates can be controlled independently of one another by separate word lines 236 and 238.

FIG. 2C uses broken lines to show a possibility for connecting the word lines 232 and 236 of the respective left-hand vertical selection transistors 220 and 228, to one another, and word lines 234 and 238 of the respective right-hand vertical selection transistors 222 and 230 to one another. In other words, for example, all of the even or all of the odd word lines are connected to one another so that a parallel driving of the gates of a series of test structures can be performed. The equivalent circuit diagram shown in FIG. 2C clearly illustrates that in either pair of transistors, for example 220 and 222, the transistors always operate serially.

Whereas in the above-described circuit arrangement illustrated in FIGS. 2A–2C, by way of example, two laterally offset vertical selection transistors are connected to one another back to back by a test structure, an exemplary embodiment of the present invention in which a test structure connects a larger number of vertical selection transistors in chain form will now be described with reference to FIGS. 3A and 3B.

Figure 3A:
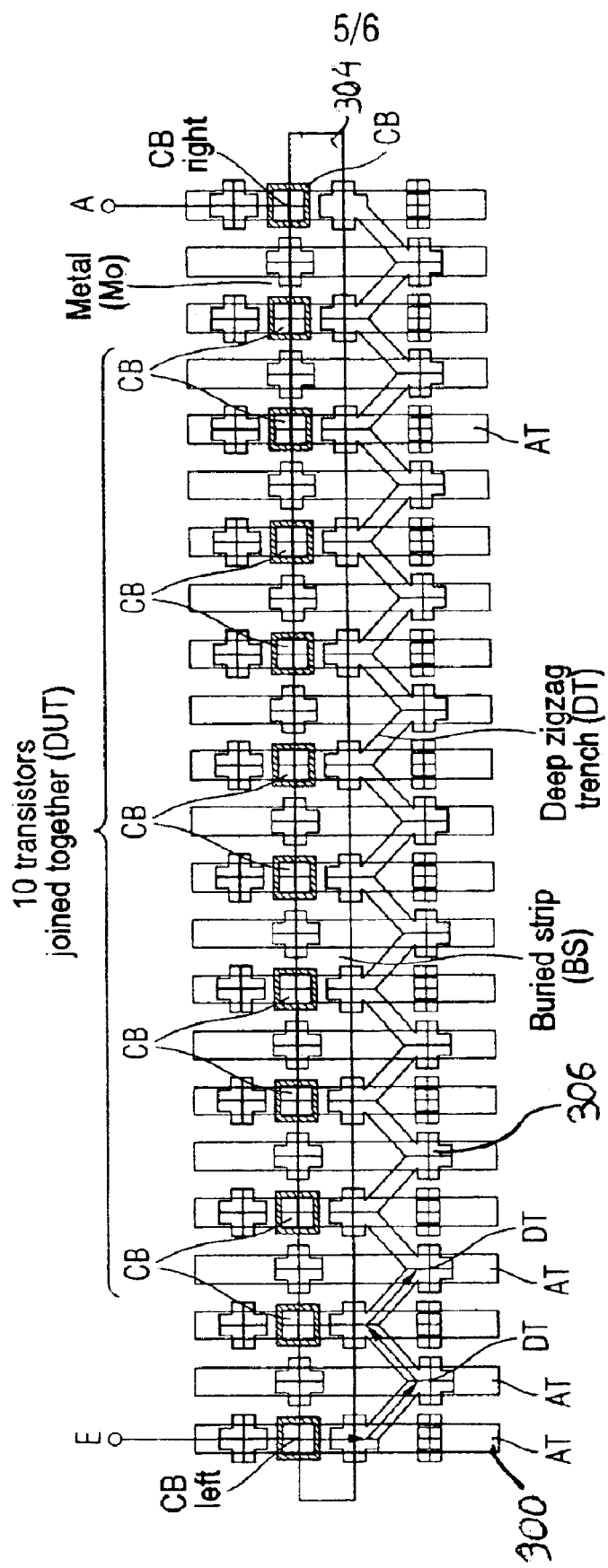
FIG. 3A shows a diagrammatic plan view of a test structure in accordance with an examplary embodiment of the present invention in which ten transistors are connected as test objects to one another.
Figure 3B:
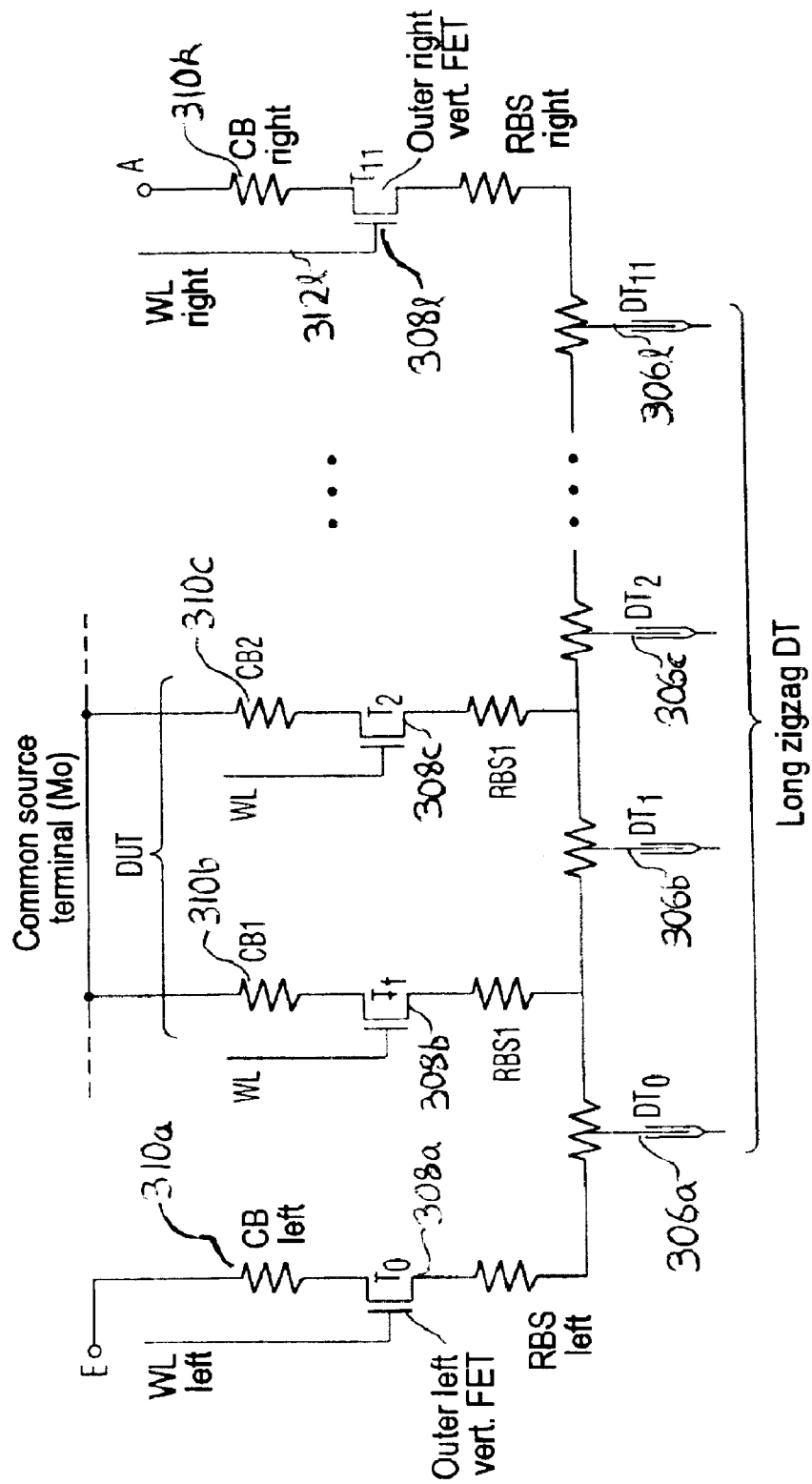
FIG. 3B illustrates an equivalent circuit diagram with discrete elements of the test structure shown in FIG. 3A.

FIG. 3A depicts, similarly to FIG. 2A, a section of a transistor array with vertically arranged active webs (AT) 300 and a metal plane M0 which lies horizontally and forms a bit line. FIG. 3A likewise shows the layout representation of a buried strip (BS)304, which forms drain electrodes of vertical selection transistors at the intersection of the BS shape with deep trench 306 and active web 300. As shown in FIG. 3A, deep trench 306 has the form of a zigzag strip. The chain formed by the integrated test structure depicted in FIG. 3a connects ten transistors to one another. Two outermost additional vertical selection transistors serve as left-hand and right-hand complex drain terminal E, A. The integrated test structure illustrated in FIG. 3A thus enables the necessary access for measurement purposes to the buried structures (for instance at the drains) of the vertical selection transistors, with separate currentless and current-carrying access. For the sake of better clarity, the word lines are omitted in FIG. 3A, even though in reality they lie parallel to the active webs AT. Deep trench 306 running in zigzag form is composed of diagonal DT sections which, in principle, are formed in the same manner as described above with reference to FIGS. 2A and 2B. FIG. 3B shows the equivalent circuit diagram of the test structure illustrated diagrammatically as a layout in FIG. 3A. The long zigzag DT comprises the sections 306a to 306l and connects twelve vertical selection transistors 308a to 308l, the ten inner ones of which form the test object (DUT). Vertical selection transistor 308a on the outer left forms left-hand terminal E. Vertical selection transistor 308l on the outer right forms terminal A. All the source terminals are routed toward the outside through CB 310 (source contacts to the bit line). A bit line formed by the metal plane M0 is common to all the source terminals of the ten selection transistors 308b–308l that are to be tested by the test structure, while the CB terminals for the FET selection transistors 308a and 308l on the left and right are embodied separately.

In another embodiment of the present invention, a test structure has a plurality of chains each having a different number of selection transistors that are connected to one another, where the respective number of the FET selection transistors connected to one another by the test chains are significantly different between different chains. Thus, by way of example, in each case 2, 10, 80 etc. vertical selection transistors may be connected to one another in different chains.

As already explained with reference to FIGS. 3A and 3B, in embodiments of the present invention selection transistors are connected to one another by the test structure according to the invention may be connected either in series or in parallel with one another by connection of corresponding word lines and bit lines. The transistor test chain illustrated in FIGS. 3A and 3B also permits the evaluation of the properties of vertical FET transistors 308a and 308l on the outer left and right, which act as complex drain parts, since said transistors can influence the measured values of the vertical FET transistors that are connected to one another and are the prime object of measurement. In particular, by measuring the properties of test chains having a different number of connected vertical FET transistors, it is possible to identify an offset attributable to these outer connection transistors.

By driving high word lines 312a and 312l of the transistors 308a and 308l, respectively, the latter are opened and thus permit a detection of leakage currents into buried strips 304 and into diverse semiconductor junctions in the vicinity of the buried strips 304.

In preferred embodiments, the test structure described above has a second connecting means for the common connection of the source electrodes of the selection transistors encompassed by the test structure, and the second connecting means preferably contain bit line contacts and bit lines of the vertical selection transistors encompassed by the test structure.

In alternate embodiments of the test structure according to the present invention, two adjacent selection transistors are laterally offset by one cell, or by a plurality of cell units, wherein in each case one deep trench is extended diagonally between two laterally offset vertical selection transistors.

In another embodiment of the test structure according to the present invention, a multiplicity of vertical, laterally offset selection transistors are connected to one another in chain form by diagonally extended deep trenches, and a plurality of such chains may be present. In this embodiment, it is preferable for the respective number of selection transistors of the individual chains that are connected to one another to be significantly different. The transistors respectively located the furthest on the outer left and right of each chain enable access to the intervening selection transistors to be tested via the first and second connecting means.

Overall, an integrated circuit arrangement equipped with such a test structure enables the measurement and the evaluation of leakage currents at different semiconductor junctions, a measurement and evaluation of capacitances and overlap capacitances between different sections of the integrated circuit arrangement, and also a stress test for determining the reliability of the entire integrated circuit arrangement.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. An integrated circuit architecture comprising
    an array of vertical FET selection transistors formed in a substrate in the form of parallel active webs made of semiconductor material arranged in a lateral direction of the circuit, wherein selection transistor drain terminals are formed by conductive strips buried below the active webs, and wherein selection transistor gates are formed by a spacer etched vertically at the side of the active webs;
    an array of memory cells each comprising a storage capacitor, wherein a buried strip makes contact with an electrode of the storage capacitor;
    a wordline for the memory cells of the memory array formed by the vertically etched spacer, wherein each storage capacitor is formed in a deep trench, which in each case delimits on an end side a section of the active web that contains the selection transistor, and which is filled with conductive electrode material; and
    a test structure integrated into the integrated circuit architecture, wherein the test structure includes a connection for common connection of the drain terminals of a plurality of vertical selection transistors, as first connecting means, wherein the first connecting means comprises diagonally extended deep trenches filled with the conductive electrode material, deposed between two adjacent laterally offset vertical FET transistors, wherein the buried strips present there form drain electrodes of the vertical selection transistors at the intersection of the buried strip form with the diagonally extended deep trench and active web.

2. The integrated circuit architecture of claim 1, wherein the test structure includes a second connecting means for common connection of the source electrodes of the vertical selection transistors, encompassed by the test structure.

3. The integrated circuit architecture of claim 2, wherein the second connecting means comprises bit line contacts and bit lines of the vertical selection transistors.

4. The integrated circuit architecture of claim 1, wherein the adjacent selection transistors are laterally offset by in each case at least one cell unit, and wherein in each case one deep trench is extended diagonally between in each case two laterally offset vertical selection transistors.

5. The integrated circuit architecture of claim 4, wherein the at least one cell unit comprises a plurality of cell units.

6. The integrated circuit architecture of claim 1, wherein the test structure has a plurality of chains of a multiplicity of vertical selection transistors that are in each case connected to one another, wherein the diagonally extended deep trenches of each chain form a zigzag course between the selection transistors that are connected to one another.

7. The integrated circuit architecture of claim 6, wherein the number of selection transistors of each chain that are connected to one another by the test structure varies significantly between chains.

8. The integrated circuit architecture of claim 1, wherein two outermost selection transistors of a chain of the test structure are connected by their source terminals to a respectively associated bit line separately by CB contacts.

9. An integrated circuit architecture comprising:
   an memory array including an array of memory cells, wherein each cell comprises a vertical FET selection transistor associated with a trench capacitor, and wherein the selection transistors are formed in active webs such that the drain terminals of the selection transistors are formed by conductive strips buried below the active webs; and
   a test structure integrated into the integrated circuit architecture, wherein the test structure includes a first connection means for common connection of the drain terminals of a plurality of vertical selection transistors, wherein the first connection means comprises diagonally extended deep trenches filled with a conductive electrode material, deposed between two adjacent laterally offset vertical FET transistors, and wherein buried strips present there form drain electrodes of the vertical selection transistors at the intersection of the buried strip form with the diagonally extended deep trench and active web.

10. The integrated circuit architecture of claim 9, wherein the test structure includes a second connecting means for common connection of the source electrodes of the vertical selection transistors, encompassed by the test structure.

11. The integrated circuit architecture of claim 10, wherein the second connecting means comprises bit line contacts and bit lines of the vertical selection transistors.

12. The integrated circuit arrangement of claim 9, wherein the adjacent selection transistors are laterally offset by in each case at least one cell unit, and wherein in each case one deep trench is extended diagonally between in each case two laterally offset vertical selection transistors.

13. The integrated circuit architecture of claim 12, wherein the at least one cell unit comprises a plurality of cell units.

14. The integrated circuit architecture of claim 9, wherein the test structure has a plurality of chains of a multiplicity of vertical selection transistors that are in each case connected to one another, wherein the diagonally extended deep trenches of each chain form a zigzag course between the selection transistors that are connected to one another.

15. The integrated circuit architecture of claim 14, wherein the number of selection transistors of each chain that are connected to one another by the test structure varies significantly between chains.

16. An integrated circuit architecture comprising:
   a memory array including vertical FET selection transistors formed in active webs made of semiconductor material; and
   a test structure integrated into the integrated circuit architecture, wherein the test structure includes a first connection means for common connection of drain terminals of a plurality of vertical selection transistors, wherein the first connection means comprises diagonally extended deep trenches filled with a conductive electrode material, deposed between two adjacent laterally offset vertical FET transistors, and wherein buried strips present there form drain electrodes of the vertical selection transistors at the intersection of the buried strip form with the diagonally extended deep trench and active web.

17. The integrated circuit architecture of claim 16, wherein the test structure includes a second connecting means for common connection of the source electrodes of the vertical selection transistors, encompassed by the test structure.

18. The integrated circuit architecture of claim 17, wherein the second connecting means comprises bit line contacts and bit lines of the vertical selection transistors.

19. The integrated circuit architecture of claim 16, wherein the adjacent selection transistors are laterally offset by in each case at least one cell unit, and wherein in each case one deep trench is extended diagonally between in each case two laterally offset vertical selection transistors.

20. The integrated circuit architecture of claim 19, wherein the at least one cell unit comprises a plurality of cell units.

* * * * *